(12) United States Patent
Seo et al.

(10) Patent No.: US 9,741,773 B2
(45) Date of Patent: Aug. 22, 2017

(54) ORGANIC LIGHT-EMITTING DISPLAY APPARATUS

(71) Applicant: SAMSUNG DISPLAY CO., LTD., Yongin-si, Gyeonggi-Do (KR)

(72) Inventors: Ilhun Seo, Yongin-si (KR); Youngjun Shin, Yongin-si (KR); Yunmo Chung, Yongin-si (KR); Jaebeom Choi, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/098,401

(22) Filed: Apr. 14, 2016

(65) Prior Publication Data

US 2017/0012087 A1    Jan. 12, 2017

(30) Foreign Application Priority Data

Jul. 10, 2015  (KR) .................. 10-2015-0098406

(51) Int. Cl.
   *H01L 27/32*  (2006.01)
   *H01L 51/52*  (2006.01)

(52) U.S. Cl.
   CPC ...... *H01L 27/3227* (2013.01); *H01L 27/3248* (2013.01); *H01L 27/3262* (2013.01); *H01L 27/3272* (2013.01); *H01L 51/5221* (2013.01); *H01L 51/5253* (2013.01); *H01L 51/5284* (2013.01); *H01L 2251/5307* (2013.01); *H01L 2251/5315* (2013.01)

(58) Field of Classification Search
   CPC ............ H01L 51/0545; H01L 51/0036; H01L 51/0541; H01L 51/5012
   See application file for complete search history.

(56) References Cited

U.S. PATENT DOCUMENTS 7,289,088 B2 * 10/2007 Matsumoto ........... G06F 3/0421
                                                        345/76
2010/0102301 A1    4/2010 Yang et al.
(Continued)

FOREIGN PATENT DOCUMENTS

| JP | 2008-145835 | 6/2008 |
|----|-------------|--------|
| JP | 2010-078853 | 4/2010 |
| KR | 10-2010-0047456 | 5/2010 |

*Primary Examiner* — Quoc Hoang
(74) *Attorney, Agent, or Firm* — F. Chau & Associates, LLC

(57) ABSTRACT

An organic light-emitting display apparatus includes a display area including first and second pixels. A plurality of photo sensors is arranged in an outer area of the display area. The first pixel includes a first pixel electrode, an opposite electrode, and a first emission layer between the first pixel electrode and the opposite electrode. The first pixel electrode, the opposite electrode, and the first emission layer are arranged on a substrate. The second pixel includes a second pixel electrode, the opposite electrode having a reflectance less than a reflectance of the second pixel electrode, and a second emission layer between the second pixel electrode and the opposite electrode. The second pixel is closer to the plurality of photo sensors than the first pixel. The second pixel electrode includes a first portion in parallel with the substrate and a second portion having a slope with respect to the substrate.

20 Claims, 7 Drawing Sheets

(56) References Cited

U.S. PATENT DOCUMENTS

2011/0108812 A1\* 5/2011 Sumita ............... H01L 27/3248
                                                                                   257/40
2013/0343087 A1   12/2013 Huang
2014/0009960 A1    1/2014 Miyamoto et al.

\* cited by examiner

ORGANIC LIGHT-EMITTING DISPLAY APPARATUS

CROSS-REFERENCE TO RELATED APPLICATION

This application claims priority under 35 U.S.C. §119 to Korean Patent Application No. 10-2015-0098406, filed on Jul. 10, 2015, in the Korean Intellectual Property Office, the disclosure of which is incorporated by reference herein in its entirety.

1. Technical Field

Exemplary embodiments of the present invention relate to a display apparatus, and more particular to an organic light-emitting display apparatus.

2. Discussion of Related Art

An organic light-emitting display apparatus may be a self-emissive display apparatus that generally includes a hole injection electrode, an electron injection electrode, and an emission layer formed between the hole injection electrode and the electron injection electrode. During operation of the organic light-emitting display apparatus, holes injected from the hole injection electrode and electrons injected from the electron injection electrode may be re-combined in the emission layer, and thus light may be emitted.

SUMMARY

One or more exemplary embodiments of the present invention may provide an organic light-emitting display apparatus having a relatively high aperture ratio, and a photo sensor with relatively high efficiency.

According to one or more exemplary embodiments of the present invention, an organic light-emitting display apparatus includes a display area including a first pixel and a second pixel. A plurality of photo sensors is arranged in an outer area of the display area. The first pixel includes a first pixel electrode, an opposite electrode having a reflectance less than a reflectance of the first pixel electrode, and a first emission layer between the first pixel electrode and the opposite electrode. The first pixel electrode, the opposite electrode, and the first emission layer are arranged on a substrate. The second pixel includes a second pixel electrode, the opposite electrode having the reflectance less than a reflectance of the second pixel electrode, and a second emission layer between the second pixel electrode and the opposite electrode. The second pixel electrode, the opposite electrode, and the second emission layer are arranged on the substrate. The second pixel is closer to the plurality of photo sensors than the first pixel. The second pixel electrode includes a first portion in parallel with the substrate and a second portion having a slope with respect to the substrate.

The second pixel may be adjacent to an outer edge of the display area.

A first thin-film transistor may be arranged between the first pixel electrode and the substrate. A second thin-film transistor may be arranged between the second pixel electrode and the substrate. A first organic insulating layer may be arranged between the first pixel electrode and the first thin-film transistor and between the second pixel electrode and the second thin-film transistor.

A top surface of the first organic insulating layer in the second pixel may include a first portion in parallel with the substrate and a second portion having a slope with respect to the substrate.

The first portion of the second pixel electrode may be arranged on the first portion of the first organic insulating layer, and the second portion of the second pixel electrode may be arranged on the second portion of the first organic insulating layer.

A first portion of the second emission layer may be arranged on the first portion of the second pixel electrode, and a second portion of the second emission layer may be arranged on the second portion of the second pixel electrode.

The slope of the second portion of the first organic insulating layer may form an angle equal to or greater than 0 degrees and less than 90 degrees with a direction that is perpendicular to the substrate in the second portion of the first organic insulating layer.

The opposite electrode may be formed as one body in the first pixel and the second pixel.

The organic light-emitting display apparatus may include a second organic insulating layer that covers both end portions of the first pixel electrode. The second organic insulating layer may cover one end portion of the second pixel electrode and might not cover another end portion of the second pixel electrode.

In the second pixel, the second organic insulating layer may have an asymmetrical shape with respect to a direction that is perpendicular to the substrate.

The organic light-emitting display apparatus may include an encapsulation member arranged in the display area. A light blocking layer arranged between the encapsulation member and the second pixel.

The second pixel electrode may include a plurality of first portions and a plurality of second portions.

The plurality of first portions of the second pixel electrode may each have different heights with respect to the substrate.

A first thin-film transistor may be arranged between the first pixel electrode and the substrate. A second thin-film transistor may be arranged between the second pixel electrode and the substrate. A first organic insulating layer may be arranged between the first pixel electrode and the first thin-film transistor and between the second pixel electrode and the second thin-film transistor.

A top surface of the first organic insulating layer in the second pixel may include a plurality of first portions in parallel with the substrate and a plurality of second portions having slopes with respect to the substrate.

The plurality of first portions of the second pixel electrode may be respectively arranged on the plurality of first portions of the first organic insulating layer. The plurality of second portions of the second pixel electrode may be respectively arranged on the plurality of second portions of the first organic insulating layer.

A plurality of first portions of the second emission layer may be respectively arranged on the plurality of first portions of the second pixel electrode. A plurality of second portions of the second emission layer may be respectively arranged on the plurality of second portions of the second pixel electrode.

Each of the plurality of second portions of the second pixel electrode may have an angle equal to or greater than 0 degrees and less than 90 degrees with respect to a direction that is perpendicular to the substrate in each of the plurality of second portions of the first organic insulating layer.

In the second pixel, the first organic insulating layer may have an asymmetrical shape with respect to a direction that is perpendicular to the substrate.

The organic light-emitting display apparatus may include a second organic insulating layer that covers both end portions of the first pixel electrode. The second organic insulating layer may cover one end portion of the second pixel electrode and might not cover another end portion of the second pixel electrode.

In the second pixel, the second organic insulating layer may have an asymmetrical shape with respect to a direction that is perpendicular to the substrate.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION

Figure 1:
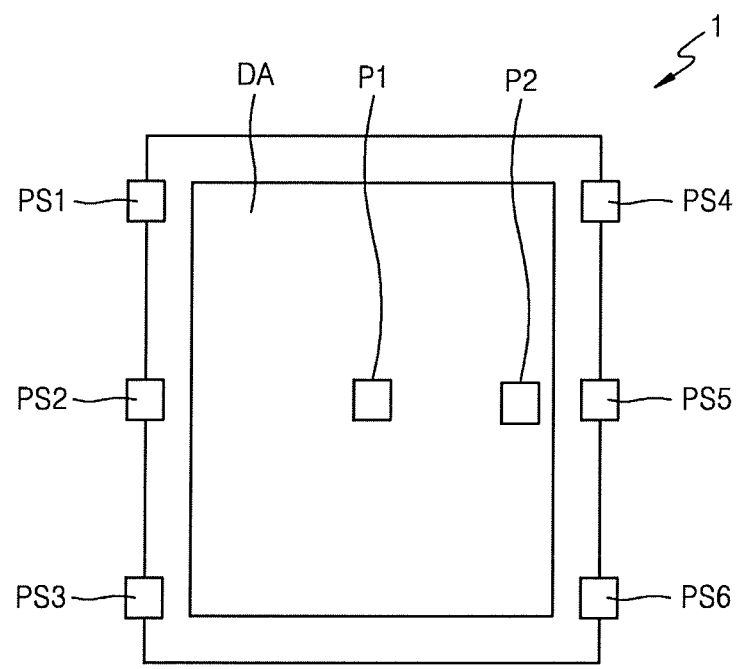
FIG. 1 illustrates a plan view of an organic light-emitting display apparatus according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein. Exemplary embodiments of the present invention may be embodied in many different forms and should not be construed as being limited to the embodiments set forth herein.

One or more exemplary embodiments of the present invention will be described in more detail below with reference to the accompanying drawings. In the specification and drawings, like reference numerals may refer to like elements. Duplicative descriptions may be omitted.

It will be understood that although the terms "first" and "second" may be used herein to describe various components, these components should not be limited by these terms.

In one or more exemplary embodiments of the present invention, a singular form may include plural forms.

In one or more exemplary embodiments of the present invention, it will also be understood that when an element such as layer, region, or component is referred to as being "on" another element, it may be directly on the other element, or intervening elements such as layer, region, or component may also be disposed between the elements or components.

In the drawings, the sizes of layers and regions may be exaggerated for clarity.

Figure 2:
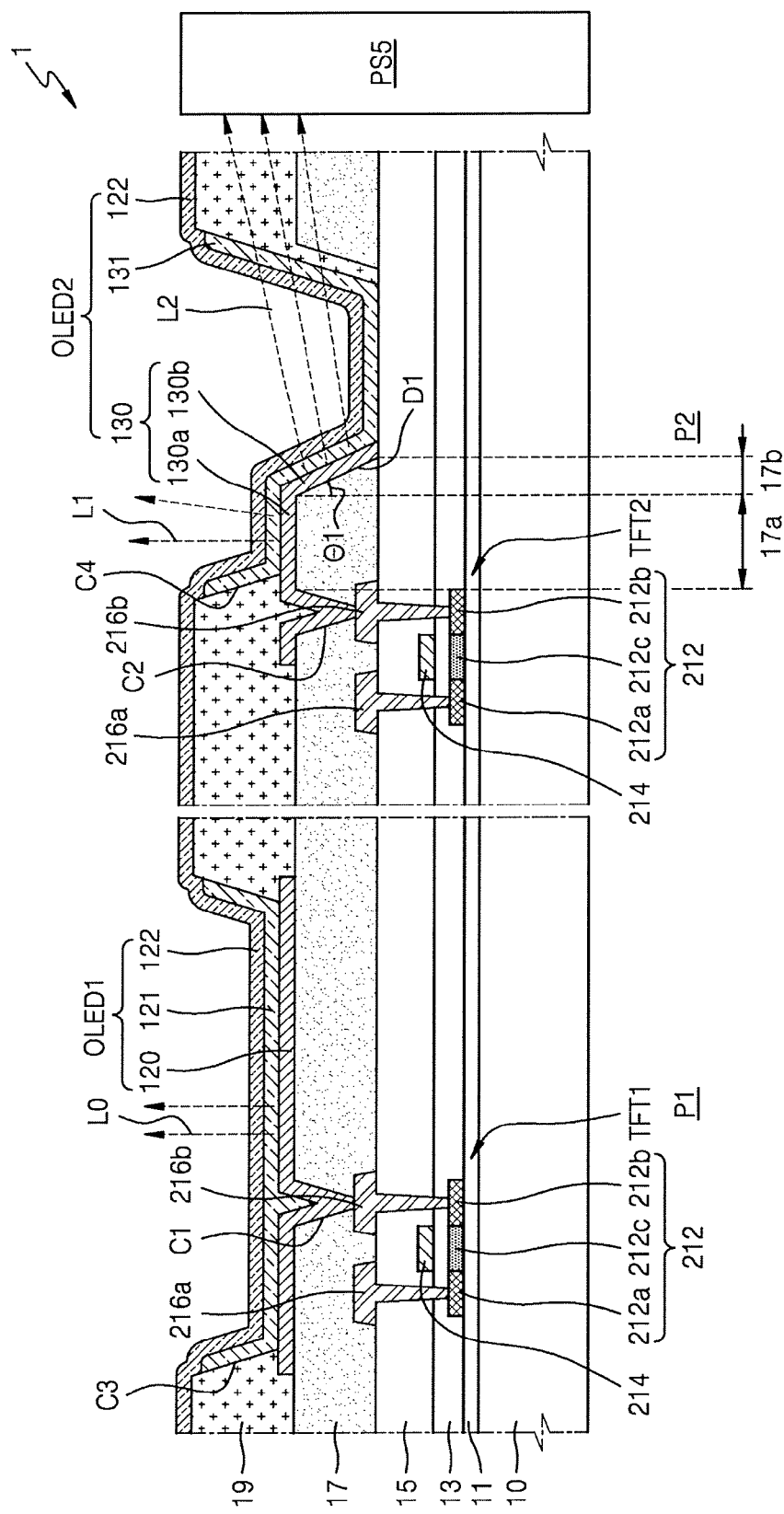
FIG. 2 illustrates a cross-sectional view illustrating portions of a pixel and a photo sensor of an organic light-emitting display apparatus according to an exemplary embodiment of the present invention.

FIG. 1 illustrates a plan view of an organic light-emitting display apparatus according to an exemplary embodiment of the present invention. FIG. 2 illustrates a cross-sectional view illustrating portions of a pixel and a photo sensor of an organic light-emitting display apparatus according to an exemplary embodiment of the present invention.

Referring to FIG. 1, a display area DA including a plurality of first pixels P1 and a plurality of second pixels P2 may be arranged on a substrate 10. Although FIG. 1 illustrates one first pixel P1 and one second pixel P2, an organic light-emitting display apparatus 1 may include the plurality of first pixels P1 and the plurality of second pixels P2 in the display area DA.

A plurality of photo sensors PS1, PS2, PS3, PS4, PS5 and PS6 may sense a portion of light emitted from each of the first pixel P1 and the second pixel P2 and may be arranged in an outer area of the display area DA. Compared to the first pixels P1, the second pixels P2 may be closer to the plurality of photo sensors PS1, PS2, PS3, PS4, PS5 and PS6 may be arranged in an outer area of the display area DA.

The photo sensors PS1, PS2, PS3, PS4, PS5 and PS6 may sense a portion of light emitted from each of the first pixel P1 and the second pixel P2.

When the organic light-emitting display apparatus 1 is driven for a relatively long time, an emission layer of each of the first pixel P1 and the second pixel P2 may deteriorate and thus spots may occur in the display area DA. The organic light-emitting display apparatus 1 including the photo sensors PS1, PS2, PS3, PS4, PS5 and PS6 may recognize a level of deterioration of the display area DA based on data about the amount of light sensed by the photo sensors PS1, PS2, PS3, PS4, PS5 and PS6, and may correct an irregular luminance of the display area DA by using a correction system, and thus, the occurrence of spots may be reduced or eliminated.

FIG. 1 illustrates that 6 photo sensors PS1, PS2, PS3, PS4, PS5 and PS6 may be arranged in the outer area of the display area DA. However, exemplary embodiments of the present invention are not limited thereto and more photo sensors than the photo sensors PS1, PS2, PS3, PS4, PS5 and PS6 may be arranged in the display area DA and locations of the photo sensors PS1, PS2, PS3, PS4, PS5 and PS6 may vary in the outer area of the display area DA.

Referring to FIG. 2, the first pixel P1 and the second pixel P2 may be disposed on the substrate 10, and the photo sensor PS5 may be disposed in the outer area of the display area DA.

The first pixel P1 may include a first thin-film transistor TFT1 and a first organic light-emitting device OLED1, and the second pixel P2 may include a second thin-film transistor TFT2 and a second organic light-emitting device OLED2.

According to an exemplary embodiment of the present invention, the first thin-film transistor TFT1 and the second thin-film transistor TFT2 may be substantially identical to each other with respect to a size, material, and structure thereof. Alternatively, the first thin-film transistor TFT1 and the second thin-film transistor TFT2 may be different from each other with respect to at least one of the size, material, and structure thereof.

The substrate 10 may include a glass substrate or a plastic substrate including polyethylene terephthalate (PET), polyethylene naphthalate (PEN), or polyimide.

A buffer layer 11 may be disposed on the substrate 10 to form a planar surface on the substrate 10 and to reduce or prevent penetration of foreign substances. The buffer layer 11 may include a single layer or multiple layers including a silicon nitride layer and/or a silicon oxide layer.

The first thin-film transistor TFT1 and the second thin-film transistor TFT2 may be disposed on the buffer layer 11. Each of the first thin-film transistor TFT1 and the second thin-film transistor TFT2 may include an active layer 212, a gate electrode 214, a source electrode 216a, and a drain electrode 216b.

The active layer 212 may be disposed on the buffer layer 11. The active layer 212 may include a semiconductor. The semiconductor may include amorphous silicon or polysilicon. The active layer 212 may include a channel region 212c, and a source region 212a and a drain region 212b that are disposed at both sides of the channel region 212c and are doped with impurity. A material of the active layer 212 is not limited to amorphous silicon or polysilicon and may include an oxide semiconductor.

A gate insulating layer 13 may be disposed on the active layer 212. The gate insulating layer 13 may include a single layer or multiple layers including a silicon nitride layer and/or a silicon oxide layer.

The gate electrode 214 may be disposed on the gate insulating layer 13. The gate electrode 214 may include a single layer or multiple layers including at least one metal material from among aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

A wiring such as a scan line may be included in the same material layer as the gate electrode 214.

An interlayer insulating layer 15 may be deposited on the gate electrode 214. The interlayer insulating layer 15 may include a single layer or multiple layers including a silicon nitride layer and/or a silicon oxide layer.

The source electrode 216a and the drain electrode 216b may be disposed on the interlayer insulating layer 15. Each of the source electrode 216a and the drain electrode 216b may include a single layer or multiple layers including at least one metal material from among Al, Pt, Pd, Ag, Mg, Au, Ni, Nd, Ir, Cr, Li, Ca, Mo, Ti, W, Cu, and an alloy thereof.

A first organic insulating layer 17 that covers the source electrode 216a and the drain electrode 216b may be disposed on the source electrode 216a and the drain electrode 216b. The first organic insulating layer 17 may include an acryl-based polymer, an imide-based polymer, an allyl ether-based polymer, an amide-based polymer, a fluorine-based polymer, a p-xylene-based polymer, a vinyl alcohol-based polymer, polymer derivatives having a phenol group, or a combination thereof.

The first organic insulating layer 17 formed in the first pixel P1 and may cover the source electrode 216a and the drain electrode 216b. The first organic insulating layer 117 may have a planarized top surface.

When a first pixel electrode 120 is disposed on the planar top surface of the first organic insulating layer 17, luminance irregularity of a display apparatus which is caused due to an irregular surface of the first pixel electrode 120 may be reduced or prevented.

A first via hole C1 may be formed in the first organic insulating layer 17 formed in first pixel P1. The first pixel electrode 120 of the first organic light-emitting device OLED1 may be connected to one of the source electrode 216a and the drain electrode 216b of the first thin-film transistor TFT1 via the first via hole C1. Referring to FIG. 2, the first pixel electrode 120 may be connected to the drain electrode 216b but the first pixel electrode 120 may be connected to the source electrode 216a.

A top surface of the first organic insulating layer 17 formed in the second pixel P2 may have a first portion 17a and a second portion 17b. The first portion 17a may be parallel with the substrate 10 and the second portion 17b may have a slope D1 with respect to the substrate 10.

The slope D1 of the second portion 17b of the first organic insulating layer 17 formed in the second pixel P2 may form an angle equal to or greater than 0 degrees and less than 90 degrees with respect to a direction that is perpendicular to the substrate 10. The slope D1 may form a preset angle $\theta 1$ in a direction toward the photo sensor PS5 with respect to the direction perpendicular to the substrate 10.

A second via hole C2 may be formed in the first organic insulating layer 17 formed in the second pixel P2. A second pixel electrode 130 of the second organic light-emitting device OLED2 may be connected to one of the source electrode 216a and the drain electrode 216b of the second thin-film transistor TFT2 via the second via hole C2. Referring to FIG. 2, the second pixel electrode 130 may be connected to the drain electrode 216b but the second pixel electrode 130 may be connected to the source electrode 216a.

A data wiring, or a VDD wiring may be formed from the same material layer as the source electrode 216a and the drain electrode 216b.

A reflectance of each of the first pixel electrode 120 and the second pixel electrode 130 may be greater than a reflectance of an opposite electrode 122.

Each of the first pixel electrode 120 and the second pixel electrode 130 may include a material having a greater reflectance than that of the opposite electrode 122. For example, each of the first pixel electrode 120 and the second pixel electrode 130 may include silver (Ag) or a silver alloy.

When each of the first pixel electrode 120 and the second pixel electrode 130 includes silver (Ag) or the silver alloy, a first transparent conductive oxide layer may be disposed between the first and second pixel electrodes 120 and 130 and the first organic insulating layer 17 which may increase adhesion between the first and second pixel electrodes 120 and 130 and the first organic insulating layer 17.

A second transparent conductive oxide layer may be disposed between the first pixel electrode 120 and a first emission layer 121 and may be disposed between the second pixel electrode 130 and a second emission layer 131. The second transparent conductive oxide layer may protect the first pixel electrode 120 and the second pixel electrode 130.

Each of the first and second transparent conductive oxide layers may include at least one of indium tin oxide (ITO), indium zinc oxide (IZO), zinc oxide (ZnO), indium oxide ($In_2O_3$), indium gallium oxide (IGO), and aluminum zinc oxide (AZO).

The first pixel electrode 120 may be entirely and evenly formed on a top surface of the first organic insulating layer 17.

The second pixel electrode 130 may include a first portion 130a and a second portion 130b. The first portion 130a may be disposed on the first portion 17a of the first organic insulating layer 17, and the second portion 130b may be disposed on the second portion 17b of the first organic insulating layer 17. The second portion 130b may be disposed along the slope D1.

An opening C3 may be formed in a second organic insulating layer 19 in the first pixel P1, which may expose a top surface of the first pixel electrode 120. The second organic insulating layer 19 may cover both end portions of the first pixel electrode 120. The second organic insulating layer 19 may be a pixel-defining layer that defines an emission area of a pixel.

An opening C4 may be formed in the second organic insulating layer 19 in the second pixel P2, which may expose a top surface of the second pixel electrode 130.

The second organic insulating layer 19 may cover one end portion of the second pixel electrode 130 which is formed on a flat surface of the first organic insulating layer 17, and might not cover another end portion of the second pixel electrode 130 which is formed on the slope D1. Thus, the second organic insulating layer 19 disposed in the second pixel P2 may have an asymmetrical shape with respect to a direction that is perpendicular to the substrate 10.

The second organic insulating layer 19 may include an acryl-based polymer, an imide-based polymer, an allyl ether-based polymer, an amide-based polymer, a fluorine-based polymer, a p-xylene-based polymer, a vinyl alcohol-based polymer, polymer derivatives having a phenol group, or a combination thereof.

In the first pixel P1, the first emission layer 121 may be disposed in the opening C3 formed in the second organic insulating layer 19.

In the second pixel P2, the second emission layer 131 may be disposed in the opening C4 formed in the second organic insulating layer 19.

Each of the first emission layer 121 and the second emission layer 131 may include a small molecule organic material or a polymer organic material.

When each of the first emission layer 121 and the second emission layer 131 includes the small molecule organic material, a hole transport layer (HTL), a hole injection layer (HIL), an electron transport layer (ETL), or an electron injection layer (EIL) may be disposed between the first and second pixel electrodes 120 and 130 and the opposite electrode 122. However, exemplary embodiments of the present invention are not limited thereto, and various layers may be disposed between the first and second pixel electrodes 120 and 130 and the opposite electrode 122. For example, various organic materials including copper phthalocyanine (CuPc), N,N'-Di(naphthalene-1-yl)-N,N'-diphenyl-benzidine (NPB), or tris-8-hydroxyquinoline aluminum) (Alq3) may be disposed between the first and second pixel electrodes 120 and 130 and the opposite electrode 122.

When each of the first emission layer 121 and the second emission layer 131 includes the polymer organic material, an HTL may be disposed between the first and second pixel electrodes 120 and 130 and the opposite electrode 122. The HTL may include poly-(2,4)-ethylene-dihydroxy thiophene (PEDOT) or polyaniline (PANI). The polymer organic material may include poly-phenylene vinylene (PPV), or poly-fluorene.

An inorganic material may be disposed between the first and second pixel electrodes 120 and 130 and the opposite electrode 122.

Referring to FIG. 2, the first emission layer 121 may be disposed in the opening C3 in the first pixel P1, however, exemplary embodiments of the present invention are not limited thereto. The first emission layer 121 may be disposed not only in the opening C3 but may also extend to a top surface of the second organic insulating layer 19 along an etched surface of the opening C3.

Referring to FIG. 2, the second emission layer 131 may be disposed in the opening C4 in the second pixel P2, however, exemplary embodiments of the present invention are not limited thereto. The second emission layer 131 may be disposed not only in the opening C4 but may also extend to a top surface of the second organic insulating layer 19 along an etched surface of the opening C4.

The opposite electrode 122 may be disposed on the first emission layer 121 of the first pixel P1 and the second emission layer 131 of the second pixel P2.

The reflectance of the opposite electrode 122 may be less than the reflectance of each of the first pixel electrode 120 and the second pixel electrode 130. The opposite electrode 122 may include silver (Ag), magnesium (Mg), aluminum (Al), palladium (Pd), gold (Au), nickel (Ni), neodymium (Nd), iridium (Ir), chrome (Cr), lithium (Li), calcium (Ca), or a combination thereof.

In the first pixel P1, the reflectance of the first pixel electrode 120 may be greater than the reflectance of the opposite electrode 122, thus, a relatively large portion of light L0 from among the amount of light emitted from the first emission layer 121 may be emitted in an opposite direction of the substrate 10.

An organic light-emitting display apparatus in which light is emitted from the first emission layer 121 in an opposite direction of the substrate 10 rather than toward the substrate 10 may be referred to as a top emission type organic light-emitting display apparatus.

An organic light-emitting display apparatus in which light is emitted from the first emission layer 121 toward the substrate 10 may be referred to as a bottom emission type organic light-emitting display apparatus.

The bottom emission-type display apparatus generally does not have elements such as a thin-film transistor, a capacitor, and a wiring that block a travel of light disposed between the substrate 10 and the first organic light-emitting device OLED1 to form an emission area. The organic light-emitting display apparatus 1 according to an exemplary embodiment of the present invention may be the top emission type organic light-emitting display apparatus, and thus various elements may be disposed between the substrate 10 and the first organic light-emitting device OLED1, and thus an aperture ratio of the organic light-emitting display apparatus 1 may be increased compared to that of the bottom emission-type display apparatus.

In the second pixel P2, the reflectance of the second pixel electrode 130 may be greater than the reflectance of the opposite electrode 122, thus, a relatively large portion of light from among the amount of light emitted from the second emission layer 131 may be emitted from the second pixel electrode 130 toward the opposite electrode 122.

A relatively large amount of light may be emitted toward the substrate in a bottom emission-type display apparatus, and thus a photo sensor disposed in the outer area of the display area DA may collect a relatively large amount of data about the amount of emitted light. However, in a top emission type organic light-emitting display apparatus, a relatively small amount of light may be emitted toward the substrate, and thus, it the photo sensor may collect a relatively small amount of data about the amount of emitted light.

Figure 3:
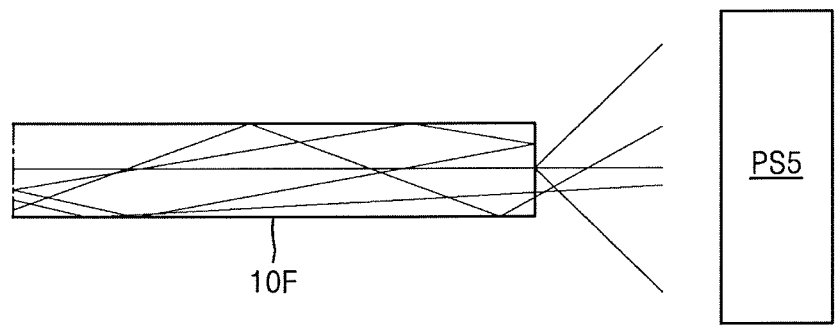
FIG. 3 illustrates a cross-sectional view illustrating a light path at a substrate end of a top emission-type organic light-emitting display apparatus.
Figure 4:
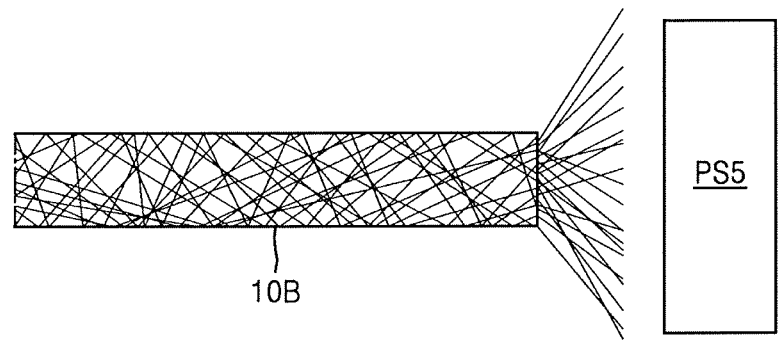
FIG. 4 illustrates a cross-sectional view illustrating a light path at a substrate end of a bottom emission-type organic light-emitting display apparatus.

FIG. 3 illustrates a cross-sectional view illustrating a light path at a substrate end of a top emission-type organic light-emitting display apparatus. FIG. 4 illustrates a cross-sectional view illustrating a light path at a substrate end of a bottom emission-type organic light-emitting display apparatus.

Referring to FIG. 3, the top emission-type organic light-emitting display apparatus may include a substrate end 10F.

Referring to FIG. 4, the bottom emission-type organic light-emitting display apparatus may include a substrate end 10B.

Referring to FIGS. 2, 3 and 4, compared to the bottom emission-type organic light-emitting display apparatus, the top emission-type organic light-emitting display apparatus may have a very small amount of light that is guided along the substrate end 10F. Therefore, an insufficient amount of light reaches a photo sensor PS5 located in an outer area of a display area.

According to an exemplary embodiment of the present invention, in the second pixel P2, light L1 may be emitted from the second emission layer 131 disposed on the first portion 130a of the second pixel electrode 130. The second emission layer 131 may be parallel with the substrate 10. The light L1 may be emitted in the opposite direction of the substrate 10.

Light L2 may be emitted from the second emission layer 131 disposed on the second portion 130b of the second pixel electrode 130, which may be disposed along the slope D1. The light L2 may be diffused toward the photo sensor PS5 disposed in an outer area of the display area.

In the organic light-emitting display apparatus 1 according to an exemplary embodiment of the present invention, the second portion 130b of the second pixel electrode 130 may be disposed along the slope D1, and the second emission layer 131 may be disposed on the slope D1, and thus, although the organic light-emitting display apparatus 1 may be a top emission-type display apparatus, the amount of light that reaches the photo sensor PS5 may be increased.

The photo sensor PS5 may recognize a level of deterioration of the display area DA based on the collected data about the amount of emitted light, may correct an irregular luminance of the display area DA by using an appropriate correction system, and thus, the occurrence of spots may be reduced or eliminated. Thus, a display quality of the organic light-emitting display apparatus 1 may be increased.

In the organic light-emitting display apparatus 1 according to an exemplary embodiment of the present invention, each of the first pixel electrode 120 and the second pixel electrode 130 may be an anode and the opposite electrode 122 may be a cathode, but polarities of the electrodes may be switched.

Although not illustrated in FIG. 2, the organic light-emitting display apparatus 1 according to an exemplary embodiment of the present invention may include a switching transistor, a compensating transistor, and a driving transistor.

The organic light-emitting display apparatus 1 according to an exemplary embodiment of the present invention may include at least one capacitor. An electrode of the capacitor may include a same material as the gate electrode 214, and another electrode of the capacitor may include a same material as the source electrode 216a and the drain electrode 216b.

Figure 5:
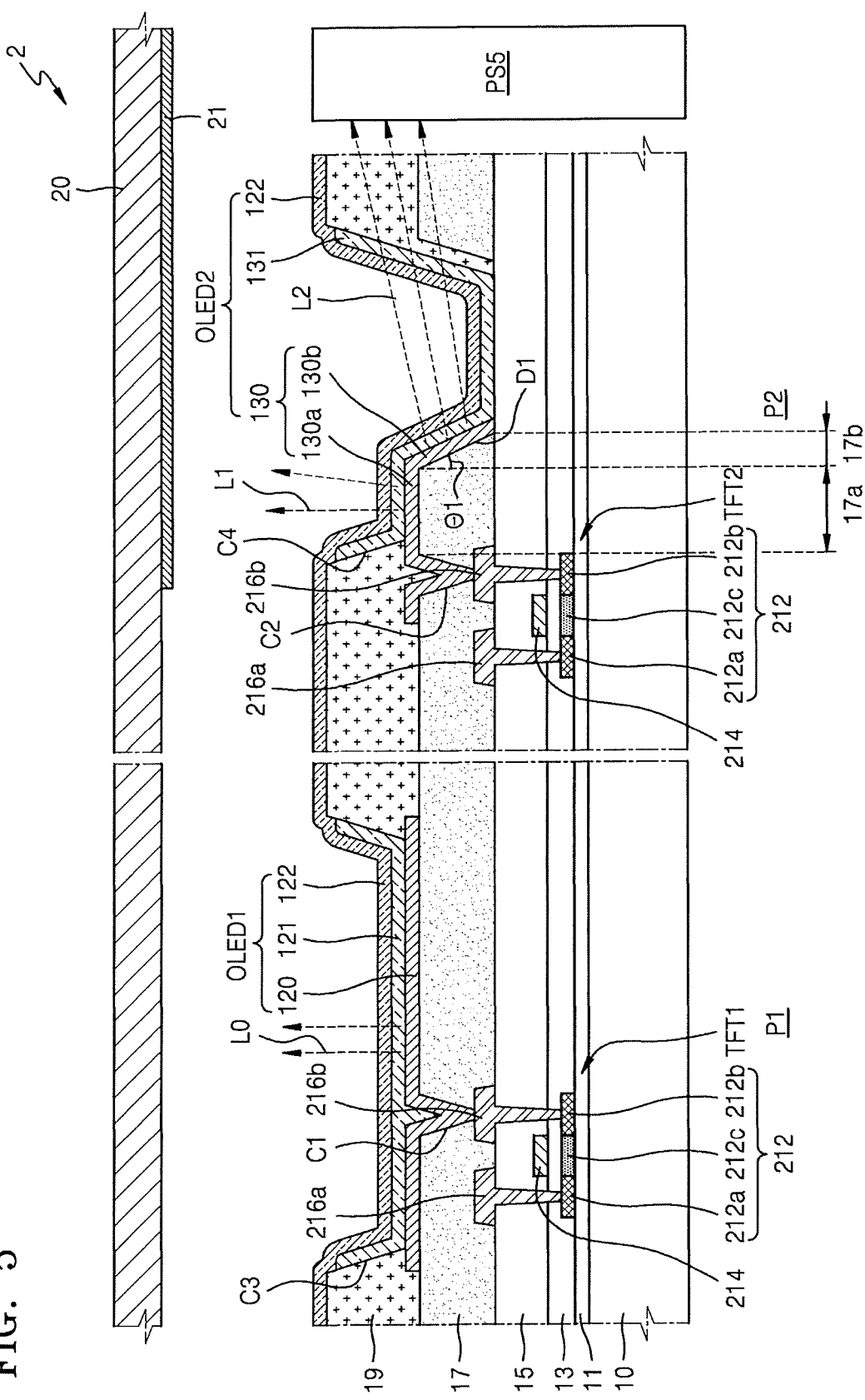
FIG. 5 illustrates a cross-sectional view illustrating portions of a pixel and a photo sensor of an organic light-emitting display apparatus according to an exemplary embodiment of the present invention.

FIG. 5 illustrates a cross-sectional view illustrating portions of a pixel and a photo sensor of an organic light-emitting display apparatus according to an exemplary embodiment of the present invention.

An organic light-emitting display apparatus 2 according to an exemplary embodiment of the present invention will be described in more detail below with reference to FIG. 5. The organic light-emitting display apparatus 2 may be described with reference to differences between the organic light-emitting display apparatus 2 and the organic light-emitting display apparatus 1 according to an exemplary embodiment of the present invention.

In the organic light-emitting display apparatus 2 according to an exemplary embodiment of the present invention, the first pixel P1 and the second pixel P2 may be arranged on a substrate 10, and the photo sensor PS5 may be disposed in the outer area of the display area DA (see, e.g., FIG. 1).

A structure of each of the first pixel P1 and the second pixel P2 may be substantially the same as the organic light-emitting display apparatus 1 according to an exemplary embodiment of the present invention. However, the organic light-emitting display apparatus 2 according to an exemplary embodiment of the present invention may include an encapsulation member 20 that encapsulates the display area DA including the first pixel P1 and the second pixel P2.

The encapsulation member 20 may include a substrate including a glass material, a metal film, or an encapsulation thin film. The encapsulation thin film may include an organic insulating film and an inorganic insulating film that are alternately stacked.

A light blocking layer 21 may be disposed between the encapsulation member 20 and the second pixel P2. The light blocking layer 21 may be a light-leakage prevention structure. The light blocking layer 21 may reduce or eliminate a leakage light, which is emitted from the second emission layer 131 of the second pixel P2, to the outside of the organic light-emitting display apparatus 2.

The organic light-emitting display apparatus 2 according to an exemplary embodiment of the present invention may be a top emission-type display apparatus in which a reflectance of each of a first pixel electrode 120 and a second pixel electrode 130 is greater than a reflectance of an opposite electrode 122, thus, the organic light-emitting display apparatus 2 may have an increased aperture ratio, compared to that of a bottom emission-type organic light-emitting display apparatus.

Light L2 emitted from the second emission layer 131 disposed on a second portion 130b of the second pixel electrode 130, which may be disposed along a slope D1, may be emitted toward the photo sensor PS5 that is disposed in the outer area of the display area DA. Thus, efficiency of a photo sensor may be increased.

Figure 6:
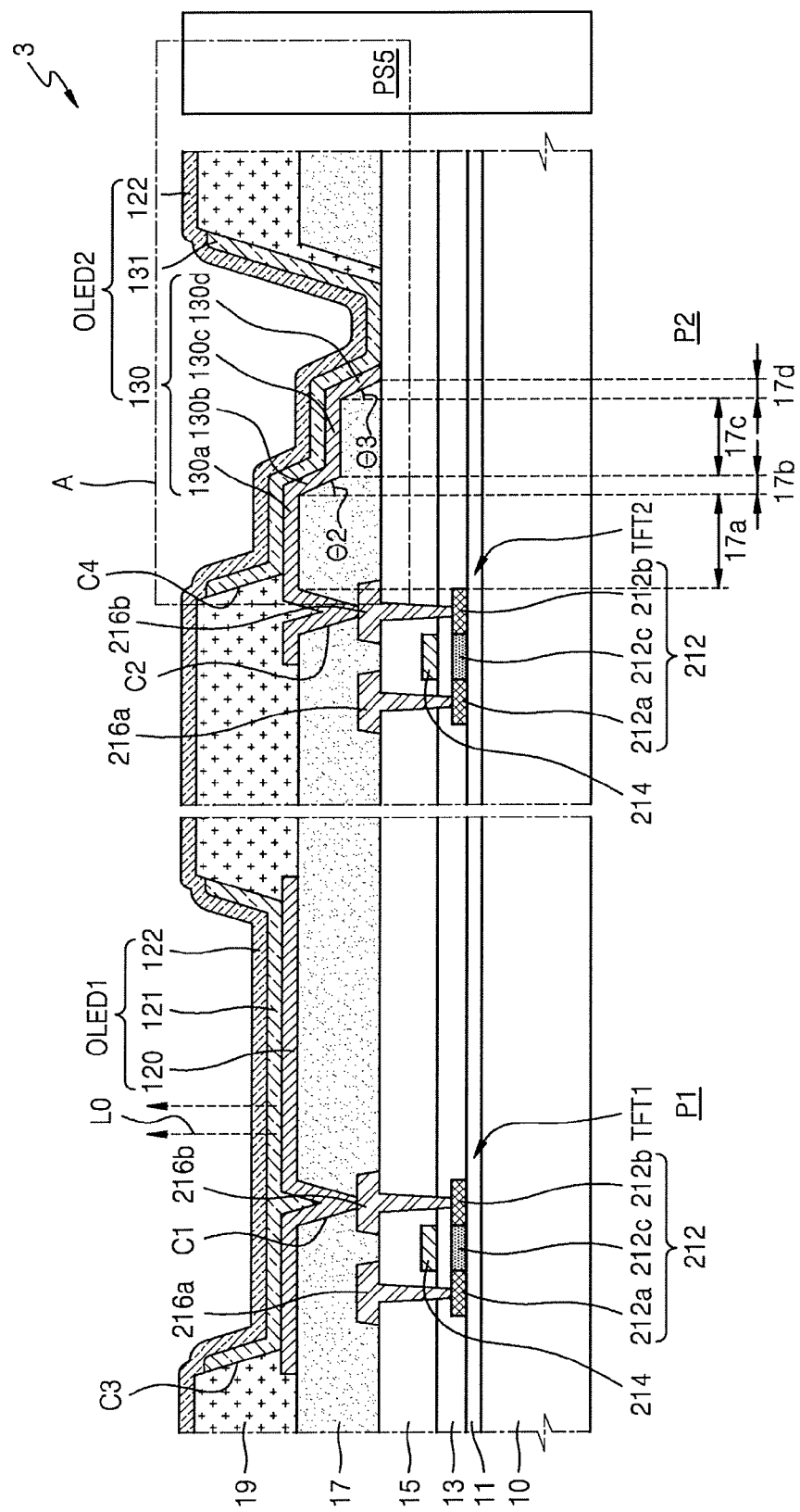
FIG. 6 illustrates a cross-sectional view illustrating portions of a pixel and a photo sensor of an organic light-emitting display apparatus according to an exemplary embodiment of the present invention.
Figure 7:
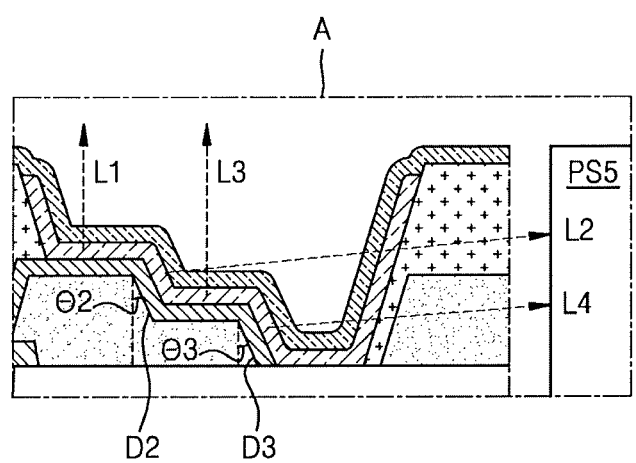
FIG. 7 illustrates a cross-sectional view illustrating a portion A of the organic light-emitting display apparatus shown in FIG. 6.

FIG. 6 illustrates a cross-sectional view illustrating portions of a pixel and a photo sensor of an organic light-emitting display apparatus according to an exemplary embodiment of the present invention. FIG. 7 illustrates a cross-sectional view illustrating a portion A of the organic light-emitting display apparatus 3 shown in FIG. 6.

An organic light-emitting display apparatus 3 according to an exemplary embodiment of the present invention will be described in more detail below with reference to FIGS. 6 and 8. The organic light-emitting display apparatus 3 may be described with reference to differences between the organic light-emitting display apparatus 3 and the organic light-emitting display apparatus 1 according to an exemplary embodiment of the present invention.

In the organic light-emitting display apparatus 3 according to an exemplary embodiment of the present invention, the first pixel P1 and the second pixel P2 may be arranged on a substrate 10, and a photo sensor PS5 may be disposed in the outer area of the display area DA (see, e.g., FIG. 1).

A structure of the first pixel P1 may be substantially the same as the organic light-emitting display apparatus 1 according to an exemplary embodiment of the present invention, but a structure of the second pixel P2 may be different from the organic light-emitting display apparatus 1 according to an exemplary embodiment of the present invention.

The first pixel P1 may include the first thin-film transistor TFT1 and the first organic light-emitting device OLED1, and the second pixel P2 may include the second thin-film transistor TFT2 and the second organic light-emitting device OLED2.

The first thin-film transistor TFT1 and the second thin-film transistor TFT2 may be substantially identical to each other with respect to a size, material, and structure thereof. Alternatively, the first thin-film transistor TFT1 and the second thin-film transistor TFT2 may be different from each other with respect to at least one of the size, material, and structure thereof. The first thin-film transistor TFT1 and the second thin-film transistor TFT2 may be substantially identical to each other with respect to the size, material, and structure thereof.

The buffer layer 11 may be disposed on the substrate 10, and the first thin-film transistor TFT1 and the second thin-film transistor TFT2, each of which may include the active layer 212, a gate electrode 214, a source electrode 216a, and a drain electrode 216b, may be disposed=on the buffer layer 11.

The first organic insulating layer 17 that may cover the source electrode 216a and the drain electrode 216b may be disposed on the source electrode 216a and the drain electrode 216b.

The first organic insulating layer 17 in the first pixel P1 may have a flat top surface, and the first via hole C1 may be formed in the first organic insulating layer 17. The first pixel electrode 120 of the first organic light-emitting device OLED1 may be connected to the first thin-film transistor TFT1 via the first via hole C1.

A top surface of the first organic insulating layer 17 in the second pixel P2 may include a plurality of first portions 17a and 17c that are parallel with the substrate 10, and a plurality of second portions 17b and 17d that have slopes D2 and D3 with respect to the substrate 10.

The first portion 17a of the first organic insulating layer 17 in the second pixel P2 may be parallel with the substrate 10, and the first portion 17c of the first organic insulating layer 17 formed in the second pixel P2 may be parallel with the substrate 10. A height of the first portion 17a may be different from a height of the first portion 17c.

A slope D2 of the second portion 17b of the first organic insulating layer 17 in the second pixel P2 may have an angle that is equal to or greater than 0 degrees and is less than 90 degrees with respect to a direction that is perpendicular to the substrate 10. The slope D2 may have a preset angle θ2 in a direction toward the photo sensor PS5.

A slope D3 of the second portion 17d of the first organic insulating layer 17 formed in the second pixel P2 has an angle that is equal to or greater than 0 degree and is less than 90 degrees with respect to a direction that is perpendicular to the substrate 10. The slope D3 may have a preset angle θ3 in a direction toward the photo sensor PS5 with respect to the direction perpendicular to the substrate 10.

The first organic insulating layer 17 disposed in the second pixel P2 may have a shape that is asymmetrical with respect to the direction that is perpendicular to the substrate 10.

The second via hole C2 may be formed in the first organic insulating layer 17 in the second pixel P2. The second pixel electrode 130 of the second organic light-emitting device OLED2 may be connected to the second thin-film transistor TFT2 via the second via hole C2.

The first pixel electrode 120 may be entirely and evenly formed on a top surface of the first organic insulating layer 17.

The second pixel electrode 130 may include the first portion 130a disposed on the first portion 17a of the first organic insulating layer 17, a second portion 130b disposed along the second portion 17b of the first organic insulating layer 17 (e.g., along the slope D2), a first portion 130c formed on the first portion 17c of the first organic insulating layer 17, and a second portion 130d formed along the second portion 17d of the first organic insulating layer 17 (e.g., along the slope D3).

The opening C3 may be formed in the second organic insulating layer 19 in the first pixel P1. The opening C3 may expose the top surface of the first pixel electrode 120. The second organic insulating layer 19 may cover both end portions of the first pixel electrode 120.

The opening C4 may be formed in the second organic insulating layer 19 in the second pixel P2. The opening C4 may expose the top surface of the second pixel electrode 130.

The second organic insulating layer 19 may cover one end portion of the second pixel electrode 130 which may be formed on a flat surface of the first organic insulating layer 17. The second organic insulating layer 19 might not cover another end portion of the second pixel electrode 130 which is formed on the slope D3. Thus, the second organic insulating layer 19 formed in the second pixel P2 may have a shape that is asymmetrical with respect to a direction that is perpendicular to the substrate 10.

In the first pixel P1, the first emission layer 121 may be disposed in the opening C3 formed in the second organic insulating layer 19. In the second pixel P2, the second emission layer 131 may be disposed in the opening C4 formed in the second organic insulating layer 19. Each of the first emission layer 121 and the second emission layer 131 may include a small molecule organic material or a polymer organic material.

The opposite electrode 122 may be disposed on the first emission layer 121 of the first pixel P1 and the second emission layer 131 of the second pixel P2. A reflectance of the opposite electrode 122 may be less than a reflectance of each of the first pixel electrode 120 and the second pixel electrode 130.

The organic light-emitting display apparatus 3 according to an exemplary embodiment of the present invention may be a top emission-type display apparatus in which the reflectance of each of the first pixel electrode 120 and the second pixel electrode 130 may be greater than the reflectance of the opposite electrode 122, thus, the organic light-emitting display apparatus 3 may have an increased aperture ratio, compared to that of a bottom emission-type organic light-emitting display apparatus.

In the first pixel P1, the reflectance of the first pixel electrode 120 may be greater than the reflectance of the opposite electrode 122, thus, a relatively large portion of light L0 from among the amount of light emitted from the first emission layer 121 may be emitted in an opposite direction of the substrate 10.

In the second pixel P2, light L1 may be emitted from the second emission layer 131 disposed on the first portion 130a of the second pixel electrode 130, and light L3 may be emitted from the second emission layer 131 disposed on the first portion 130c of the second pixel electrode 130. The first portion 130a and the first portion 130c may be parallel with the substrate 10. Light L1 and light L2 may be emitted in the opposite direction of the substrate 10.

However, a relatively large portion of light L2 emitted from the second emission layer 131 disposed on the second portion 130b of the second pixel electrode 130, which may be disposed along the slope D2, and a large portion of light L4 emitted from the second emission layer 131 disposed on the second portion 130d of the second pixel electrode 130, which may be disposed along the slope D3, may be diffused toward the photo sensor PS5 disposed in the outer area of the display area DA.

In the organic light-emitting display apparatus 3 according to an exemplary embodiment of the present invention, the second portions 130b and 130d of the second pixel electrode 130 may be respectively disposed along the slopes D1 and D3, and the second emission layer 131 may be disposed on the slopes D1 and D3, thus, although the organic light-emitting display apparatus 3 may be a top emission-type display apparatus, the amount of light that reaches the photo sensor PS5 may be increased.

The photo sensor PS5 may recognize a level of deterioration of the display area DA based on the collected data about the amount of emitted light, may correct an irregular luminance of the display area DA by using an appropriate correction system, and thus, the occurrence of spots may be reduced or eliminated. Thus, a display quality of the organic light-emitting display apparatus 3 may be increased.

Referring to FIG. 6, in the organic light-emitting display apparatus 3 according to an exemplary embodiment of the present invention, the second pixel electrode 130 may include two first portions 130a and 130c and two second portions 130b and 130d, however, exemplary embodiments of the present invention are not limited thereto.

The encapsulation member 20 including the light blocking layer 21 may be arranged at a top of the organic light-emitting display apparatus 3.

The organic light-emitting display apparatus according to one or more exemplary embodiments of the present invention may be a top emission-type display apparatus, and thus may have a higher aperture ratio than that of a bottom emission-type display apparatus.

In the organic light-emitting display apparatus according to one or more exemplary embodiments of the present invention, at least one photo sensor may be disposed in an outer area of a display area, and a pixel electrode having a sloped structure may be disposed in a side area of the display area. Thus, although the organic light-emitting display apparatus may be a top emission-type display apparatus, the amount of light that reaches the photo sensor may be increased, and thus the efficiency of the photo sensor may be increased.

It should be understood that exemplary embodiments described herein should be considered in a descriptive sense and not for purposes of limitation. Descriptions of features or aspects within each exemplary embodiment of the present invention may be available for other similar features or aspects in other exemplary embodiments of the present invention.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. An organic light-emitting display apparatus comprising:
    a display area comprising a first pixel and a second pixel;
    a plurality of photo sensors arranged in an outer area of the display area, wherein
    the first pixel comprises a first pixel electrode, an opposite electrode having a reflectance less than a reflectance of the first pixel electrode, and a first emission layer between the first pixel electrode and the opposite electrode, wherein the first pixel electrode, the opposite electrode, and the first emission layer are arranged on a substrate,
    the second pixel comprises a second pixel electrode, the opposite electrode having the reflectance less than a reflectance of the second pixel electrode, and a second emission layer between the second pixel electrode and the opposite electrode, wherein the second pixel electrode, the opposite electrode, and the second emission layer are arranged on the substrate,
    the second pixel is closer to the plurality of photo sensors than the first pixel, and
    the second pixel electrode comprises a first portion in parallel with the substrate and a second portion having a slope with respect to the substrate;
    an encapsulation member arranged in the display area; and
    a light blocking layer arranged between the encapsulation member and the second pixel.

2. The organic light-emitting display apparatus of claim 1, wherein the second pixel is adjacent to an outer edge of the display area.

3. The organic light-emitting display apparatus of claim 1, wherein
    a first thin-film transistor is arranged between the first pixel electrode and the substrate,
    a second thin-film transistor is arranged between the second pixel electrode and the substrate, and
    a first organic insulating layer is arranged between the first pixel electrode and the first thin-film transistor and between the second pixel electrode and the second thin-film transistor.

4. The organic light-emitting display apparatus of claim 3, wherein a top surface of the first organic insulating layer in the second pixel comprises a first portion in parallel with the substrate and a second portion having a slope with respect to the substrate.

5. The organic light-emitting display apparatus of claim 4, wherein
    the first portion of the second pixel electrode is arranged on the first portion of the first organic insulating layer, and
    the second portion of the second pixel electrode is arranged on the second portion of the first organic insulating layer.

6. The organic light-emitting display apparatus of claim 5, wherein
    a first portion of the second emission layer is arranged on the first portion of the second pixel electrode, and
    a second portion of the second emission layer is arranged on the second portion of the second pixel electrode.

7. The organic light-emitting display apparatus of claim 4, wherein the slope of the second portion of the first organic insulating layer forms an angle equal to or greater than 0 degrees and less than 90 degrees with a direction that is perpendicular to the substrate in the second portion of the first organic insulating layer.

8. The organic light-emitting display apparatus of claim 1, wherein the second pixel electrode comprises a plurality of first portions and a plurality of second portions.

9. The organic light-emitting display apparatus of claim 8, wherein the plurality of first portions of the second pixel electrode each have different heights with respect to the substrate.

10. The organic light-emitting display apparatus of claim 8, wherein a first thin-film transistor is arranged between the first pixel electrode and the substrate, a second thin-film transistor is arranged between the second pixel electrode and the substrate, and a first organic insulating layer is arranged between the first pixel electrode and the first thin-film transistor and between the second pixel electrode and the second thin-film transistor.

11. The organic light-emitting display apparatus of claim 10, wherein a top surface of the first organic insulating layer in the second pixel comprises a plurality of first portions in parallel with the substrate and a plurality of second portions having slopes with respect to the substrate.

12. The organic light-emitting display apparatus of claim 11, wherein the plurality of first portions of the second pixel electrode are respectively arranged on the plurality of first portions of the first organic insulating layer, and the plurality of second portions of the second pixel electrode are respectively arranged on the plurality of second portions of the first organic insulating layer.

13. The organic light-emitting display apparatus of claim 11, wherein a plurality of first portions of the second emission layer are respectively arranged on the plurality of first portions of the second pixel electrode, and a plurality of second portions of the second emission layer are respectively arranged on the plurality of second portions of the second pixel electrode.

14. The organic light-emitting display apparatus of claim 11, wherein each of the plurality of second portions of the second pixel electrode has an angle equal to or greater than 0 degrees and less than 90 degrees with respect to a direction that is perpendicular to the substrate in each of the plurality of second portions of the first organic insulating layer.

15. The organic light-emitting display apparatus of claim 11, wherein, in the second pixel, the first organic insulating layer has an asymmetrical shape with respect to a direction that is perpendicular to the substrate.

16. The organic light-emitting display apparatus of claim 11, further comprising a second organic insulating layer that covers both end portions of the first pixel electrode, wherein the second organic insulating layer covers one end portion of the second pixel electrode and does not cover another end portion of the second pixel electrode.

17. The organic light-emitting display apparatus of claim 16, wherein, in the second pixel, the second organic insulating layer has an asymmetrical shape with respect to a direction that is perpendicular to the substrate.

18. An organic light-emitting display apparatus comprising:

a display area pixel and a second pixel;

a plurality of photo sensors arranged in an outer area of the display area, wherein the first pixel comprises a first pixel electrode, an opposite electrode having a reflectance less than a reflectance of the first pixel electrode, and a first emission layer between the first pixel electrode and the opposite electrode, wherein the first pixel electrode, the opposite electrode, and the first emission layer are arranged on a substrate, the second pixel comprises a second pixel electrode, the opposite electrode having the reflectance less than a reflectance of the second pixel electrode, and a second emission layer between the second pixel electrode and the opposite electrode, wherein the second pixel electrode, the opposite electrode, and the second emission layer are arranged on the substrate, the second pixel is closer to the plurality of photo sensors than the first pixel, the second pixel electrode comprises a first portion in parallel with the substrate and a second portion having a slope with respect to the substrate; and a second organic insulating layer that covers both end portions of the first pixel electrode, wherein the second organic insulating layer covers one end portion of the second pixel electrode and does not cover another end portion of the second pixel electrode.

19. The organic light-emitting display apparatus of claim 18, wherein, in the second pixel, the second organic insulating layer has an asymmetrical shape with respect to a direction that is perpendicular to the substrate.

20. An organic light-emitting display apparatus comprising:

first and second pixels positioned in a display area, wherein the first pixel comprises a first pixel electrode and a first opposite electrode having a reflectance less than a reflectance of the first pixel electrode, and wherein the second pixel comprises a second pixel electrode and a second opposite electrode having a reflectance less than a reflectance of the second pixel electrode;

a photo sensor adjacent to the second pixel, wherein the second pixel comprises a sloped sidewall, wherein the second pixel electrode is disposed on the sloped sidewall, and wherein the second electrode faces the photo sensor;

an encapsulation member disposed on the second pixel; and a light blocking layer disposed between the encapsulation member and the second pixel.

* * * * *